(12) United States Patent
Wang et al.

(10) Patent No.: US 10,217,697 B2
(45) Date of Patent: Feb. 26, 2019

(54) SEMICONDUCTOR DEVICE AND LEAD FRAME WITH HIGH DENSITY LEAD ARRAY

(71) Applicant: NXP USA, INC., Austin, TX (US)

(72) Inventors: Zhijie Wang, Tianjin (CN); Zhigang Bai, Tianjin (CN); You Ge, Tianjin (CN); Meng Kong Lye, Petaling Jaya (MY)

(73) Assignee: NXP B.V., San Jose, CA (US)

( * ) Notice: Subject to any disclaimer, the term of this patent is extended or adjusted under 35 U.S.C. 154(b) by 34 days.

(21) Appl. No.: 15/379,502

(22) Filed: Dec. 15, 2016

(65) Prior Publication Data
US 2018/0102305 A1 Apr. 12, 2018

(30) Foreign Application Priority Data
Oct. 11, 2016 (CN) .......................... 2016 1 0886321

(51) Int. Cl.
| | |
|---|---|
| *H01L 21/70* | (2006.01) |
| *H01L 23/495* | (2006.01) |
| *H01L 21/48* | (2006.01) |
| *H01L 21/56* | (2006.01) |
| *H01L 23/31* | (2006.01) |
| *H01L 23/00* | (2006.01) |

(52) U.S. Cl.
CPC .... *H01L 23/49541* (2013.01); *H01L 21/4825* (2013.01); *H01L 21/565* (2013.01); *H01L 23/3114* (2013.01); *H01L 23/4952* (2013.01); *H01L 24/06* (2013.01); *H01L 24/49* (2013.01); *H01L 2224/04042* (2013.01)

(58) Field of Classification Search
CPC . H01L 23/49541; H01L 21/565; H01L 24/06; H01L 23/3114; H01L 24/49; H01L 21/4825; H01L 23/4952; H01L 2224/04042
USPC ......................................................... 257/670
See application file for complete search history.

(56) References Cited

U.S. PATENT DOCUMENTS

| | | | | |
|---|---|---|---|---|
| 5,406,119 A | * | 4/1995 | Numada | ........... H01L 23/49548 257/692 |
| 5,866,939 A | * | 2/1999 | Shin | .................... H01L 23/3114 257/666 |
| 6,118,174 A | * | 9/2000 | Kim | ..................... H01L 23/3107 257/666 |
| 6,683,368 B1 | | 1/2004 | Mostafazadeh | |
| 6,927,483 B1 | * | 8/2005 | Lee | ..................... H01L 23/3107 257/666 |

(Continued)

*Primary Examiner* — Mohammad M Hoque
(74) *Attorney, Agent, or Firm* — Charles E. Bergere

(57) ABSTRACT

A semiconductor device includes a lead frame having leads arranged in an array that has columns extending in a first direction and rows extending in a second direction. Each lead includes a bond pad portion and a solder pad portion down-set from the bond pad portion. The solder pad portion horizontally extends from the bond pad portion in the first direction. A semiconductor die is mounted on a set of the plurality of leads and electrically connected to the bond pad portion of at least one of the plurality of leads. The semiconductor die, and the plurality of leads are encapsulated by a molding material, wherein the molding material defines a package body, and the solder pad portion of each lead is exposed at a back side of the package body.

9 Claims, 9 Drawing Sheets

(56) References Cited

U.S. PATENT DOCUMENTS

| | | | | |
|---|---|---|---|---|
| 6,965,159 B1* | 11/2005 | Miks | ............... | H01L 23/3107 |
| | | | | 257/676 |
| 7,045,882 B2* | 5/2006 | Paek | ............... | H01L 23/3107 |
| | | | | 257/666 |
| 7,087,986 B1* | 8/2006 | Bayan | ............ | H01L 23/3107 |
| | | | | 257/676 |
| 7,476,569 B2 | 1/2009 | Retuta et al. | | |
| 8,067,821 B1* | 11/2011 | Choi | ............... | H01L 23/49551 |
| | | | | 257/666 |
| 8,415,779 B2* | 4/2013 | Wong | ............. | H01L 21/4832 |
| | | | | 257/666 |
| 8,508,032 B2* | 8/2013 | Owen | ............. | H01L 23/4951 |
| | | | | 257/692 |
| 8,575,742 B1* | 11/2013 | Kim | ............... | H01L 23/49541 |
| | | | | 257/670 |
| 9,196,504 B2 | 11/2015 | Loh et al. | | |
| 9,202,777 B2* | 12/2015 | Tay | ............... | H01L 23/49541 |
| 2003/0001244 A1* | 1/2003 | Araki | ............... | H01L 21/568 |
| | | | | 257/666 |
| 2003/0164554 A1* | 9/2003 | Fee | ................... | H01L 21/4842 |
| | | | | 257/787 |
| 2007/0052070 A1* | 3/2007 | Islam | ............... | H01L 21/561 |
| | | | | 257/666 |
| 2008/0099784 A1* | 5/2008 | Lo | ..................... | H01L 21/561 |
| | | | | 257/186 |
| 2009/0115040 A1* | 5/2009 | Camacho | ........... | H01L 21/4832 |
| | | | | 257/677 |
| 2010/0127362 A1* | 5/2010 | Fan | ..................... | H01L 24/49 |
| | | | | 257/666 |
| 2015/0102476 A1* | 4/2015 | Zhu | ................... | H01L 23/49541 |
| | | | | 257/676 |
| 2016/0141230 A1* | 5/2016 | Liu | ................... | H01L 23/49551 |
| | | | | 257/670 |

\* cited by examiner

SEMICONDUCTOR DEVICE AND LEAD FRAME WITH HIGH DENSITY LEAD ARRAY

BACKGROUND

The present invention relates to integrated circuit (IC) device assembly and, more particularly, to lead frames for semiconductor packages.

Many current quad-flat no-leads (QFN) packages include more than one row of leads to increase the number of inputs and outputs (I/Os) while maintaining the package size. FIG. 1 is a cross-sectional side view of a conventional QFN package 100 during lead singulation. The QFN package 100 is assembled using a lead frame 102 that has first and second rows of leads 104 and 106 surrounding a die flag 108. The first and second rows of leads 104 and 106, and the die flag 108 are connected to each other by a plurality of connection bars 110. A die 112 is mounted on the die flag 108 and electrically connected to the first and second rows of leads 104 and 106 with bond wires 114. The lead frame 102, die 112, and bond wires are encapsulated with a molding compound 116.

FIG. 2 shows a top plan view of the lead frame 102 of FIG. 1. After encapsulation, a half-cut process is performed by cutting the connection bars 110 with a blade 118 along a plurality of cutting lines 120 in both the X and Y directions to isolate the leads 104 and 106 from each other, and to isolate the second row of leads 106 from the die flag 108. However, as shown in FIG. 1, the half-cut process risks cutting the bond wire 114 near the lead 106. One way to avoid cutting the bond wires 114 is to attach the bond wires 114 using a wire looping profile with a higher landing angle. However, this can weaken the bond on the lead resulting in a potential reliability risk. In addition, as shown in FIG. 2, the half-cut has to be performed in both the X and Y directions, due to the minimum cutting width required for half-cut, the density of the package I/O is limited. Accordingly, it would be advantageous to have an alternative way to assemble a QFN package with multiple rows of leads.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
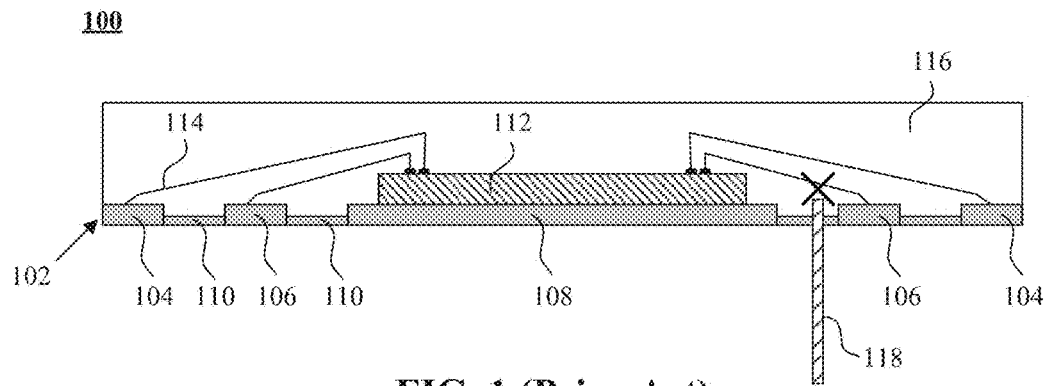
FIG. 1 is a cross-sectional side view of a conventional QFN package during lead singulation.
Figure 2:
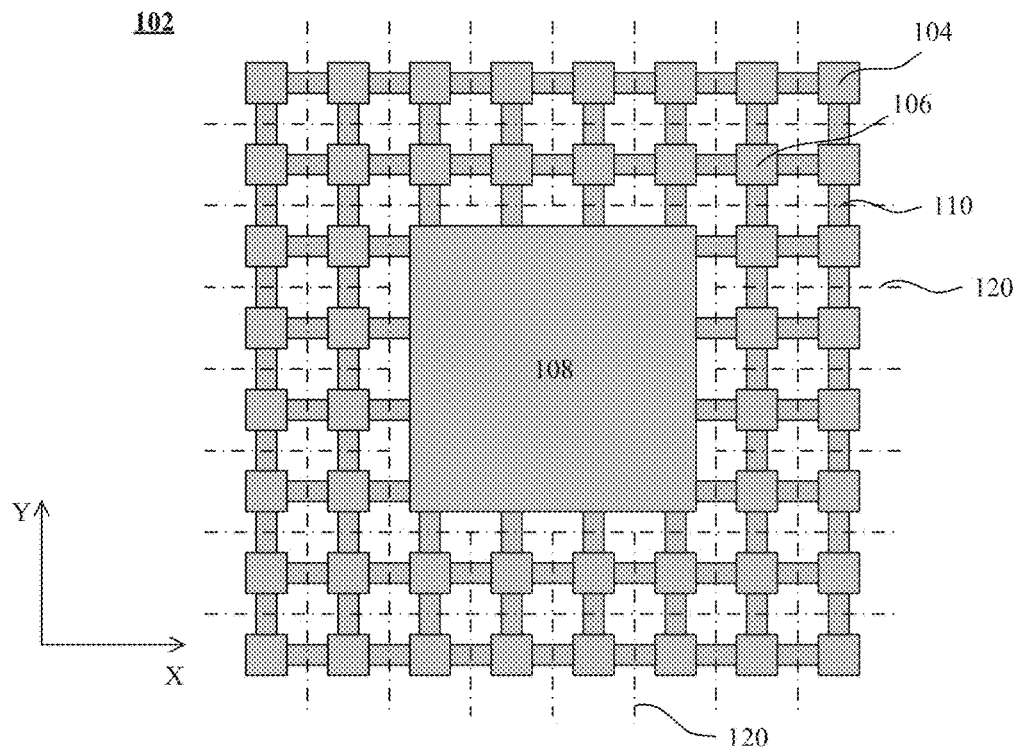
FIG. 2 is a top plan view of the conventional lead frame of FIG. 1.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. It also will be apparent to one of skill in the art that the drawings are not to scale and generally provide greatly enlarged views. Furthermore, the terms "comprises," "comprising," or variations thereof, are intended to cover a non-exclusive inclusion, such that module, circuit, device components, structures and method steps that comprise a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a semiconductor device including a lead frame having a plurality of leads arranged in an array that has a plurality of columns extending in a first direction and a plurality of rows extending in a second direction. Each lead includes a bond pad portion located in a first plane, and a solder pad portion located in a second plane down-set from the first plane. The semiconductor device further includes a semiconductor die mounted on a set of the plurality of leads and electrically connected to the bond pad portion of at least one of the plurality of leads, and a molding material that encapsulates the semiconductor die, and the leads. The molding material defines a package body. The solder pad portion of each lead is exposed at a back side of the package body.

In another embodiment, the present invention provides a lead frame including a plurality of parallel ribs extending in a first direction. Each rib has a plurality of bond pad portions, and a plurality of solder pad portions staggered with and down-set from the plurality of bond pad portions.

In yet another embodiment, the present invention provides a method for assembling or packaging a semiconductor device. The method includes providing a lead frame strip that has a plurality of parallel ribs extending in a first direction, wherein each rib includes a plurality of bond pad portions, a plurality of solder pad portions staggered with and down-set from the plurality of bond pad portions, and a plurality of connections portions connecting the plurality of bond pad portions and solder pad portions. The method further includes attaching a semiconductor die on a set of the plurality of bond pad portions, electrically connecting the die to at least one of the bond pad portions, and encapsulating the semiconductor die and the lead frame strip with a molding material. A bottom surface of each solder pad portion is exposed from the molding material. The method also may include cutting off the plurality of connection portions in each rib to form a plurality of isolated leads.

Figure 3:
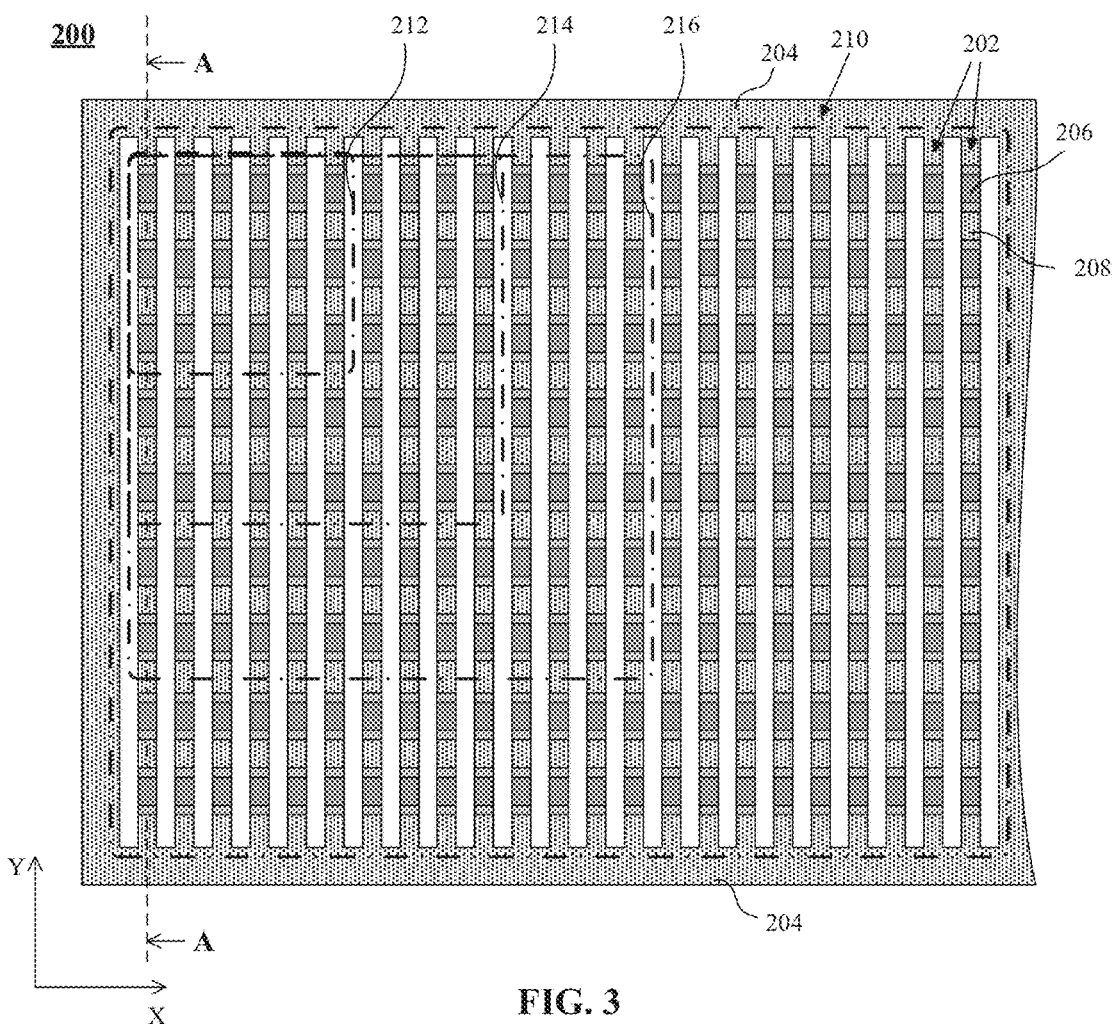
FIG. 3 is a top plan view of a universal QFN lead frame in accordance with an embodiment of the present invention.

Referring now to FIG. 3, a top plan view of a lead frame strip 200 in accordance with an embodiment of the present invention is shown. The lead frame strip 200 includes a plurality of parallel ribs 202 extending in the Y direction, and at least two tie bars 204 extending in the X direction. The tie bars 204 hold the ribs 202 at opposite ends thereof. Each rib 202 includes a plurality of bond pad portions 206 and a plurality of solder pad portions 208 horizontally staggered with and vertically down-set from the bond pad portions 206. The plurality of bond pad portions 206 of the ribs 202 form a bond pad array 210 in the lead frame strip 200. In a preferred embodiment, the lead frame strip 200 forms a universal lead frame, which includes lead frames 212, 214 and 216, which are lead frames of increasing size, which allows for varying package sizes for different packages with increasing numbers of inputs/outputs (I/Os). Each lead frame 212-216 is an individual lead frame of a semiconductor package. In a preferred embodiment, the lead frame strip 200 comprises Cu as a base material, and is pre-plated with Ni—Pd—Au for wire bonding and soldering to a printed circuit board (PCB).

Figure 4:
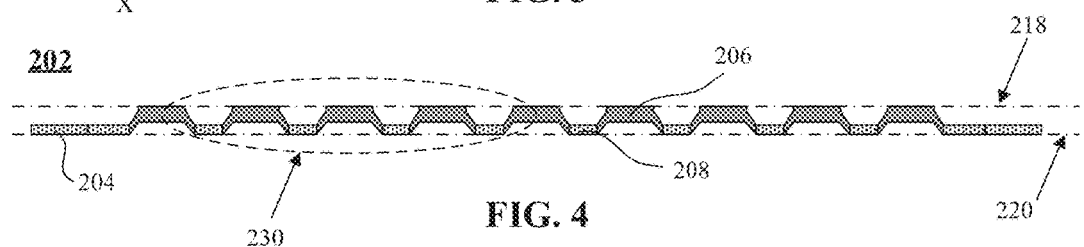
FIG. 4 is cross-sectional side view of the lead frame of FIG. 3 along line A-A in accordance with an embodiment of the present invention.

FIG. 4 is a cross-sectional side view of the rib 202 of FIG. 3 from line A-A. FIG. 4 shows that each rib 202 comprises a plurality of bond pad portions 206 located in a first plane 218 and a plurality of solder pad portions 208 located in a second plane 220 that is down-set from and parallel to the first plane 218. In a preferred embodiment, the plurality of bond pad portions 206 are horizontally staggered with the plurality of solder pad portions 208.

Figure 5:
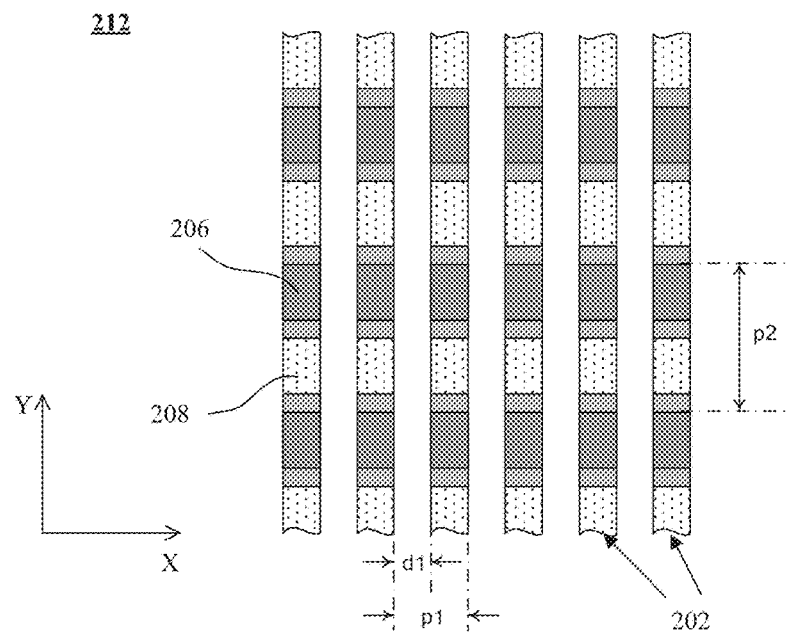
FIG. 5 is an enlarged top plan view of a first portion of the lead frame of FIG. 3 in accordance with an embodiment of the present invention.

FIG. 5 shows an enlarged top plan view of the lead frame 212 of FIG. 3. In a preferred embodiment, there is a gap in the X direction between adjacent ribs 202 having a width d1. In one embodiment, d1 is 0.2~0.3 mm, and the pitch p1 between adjacent ribs 202 is 0.45~0.55 mm. In the Y direction, the pitch p2 between adjacent bond pad portions 206 is 0.75~0.85 mm. The pitch p1 in the X direction can be smaller than the pitch p2 in the Y direction, which allows for an increasing I/O density. Having the pitch p2 greater than the pitch p1 also allows for more I/Os than a traditional mutli-row QFN package of the same outer dimensions with the same pitches in the X and Y directions and where both are limited by a minimum cutting width required for half-cut.

Figure 6:
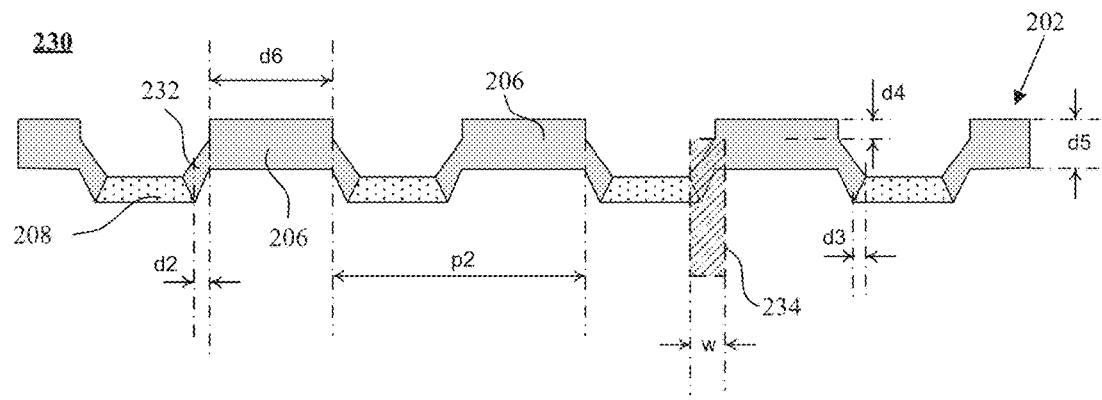
FIG. 6 is an enlarged cross-sectional side view of a portion of the lead frame of FIG. 3 in accordance with an embodiment of the present invention.

FIG. 6 is an enlarged cross-sectional side view of a portion 230 of the rib 202 of FIG. 4. The rib 202 further comprises a plurality of connection portions 232 each respectively connecting an adjacent bond pad portion 206 with a solder pad portion 208. In a preferred embodiment, a horizontal width d2 of the gap between adjacent bond pad portion 206 and solder pad portion 208 is 0.1~0.12 mm. In a preferred embodiment, the solder pad portion 208 has a top surface and a bottom surface, and a distance d3 between edges of the top and bottom surfaces is 0~0.02 mm. In another preferred embodiment, the bond pad portions 206 protrude from the connection portions 232 with a protruded thickness d4 of 0.0565~0.0705 mm. In a preferred embodiment, the protruded thickness d4 is half of the thickness of the bond pad portions d5. In a preferred embodiment, a width d6 in the Y direction of the bond pad portion 206 is 0.25~0.35 mm. A blade 234 used to singulate a lead at the connection portion 232 has a width w of 0.1~0.15 mm.

Figure 7:
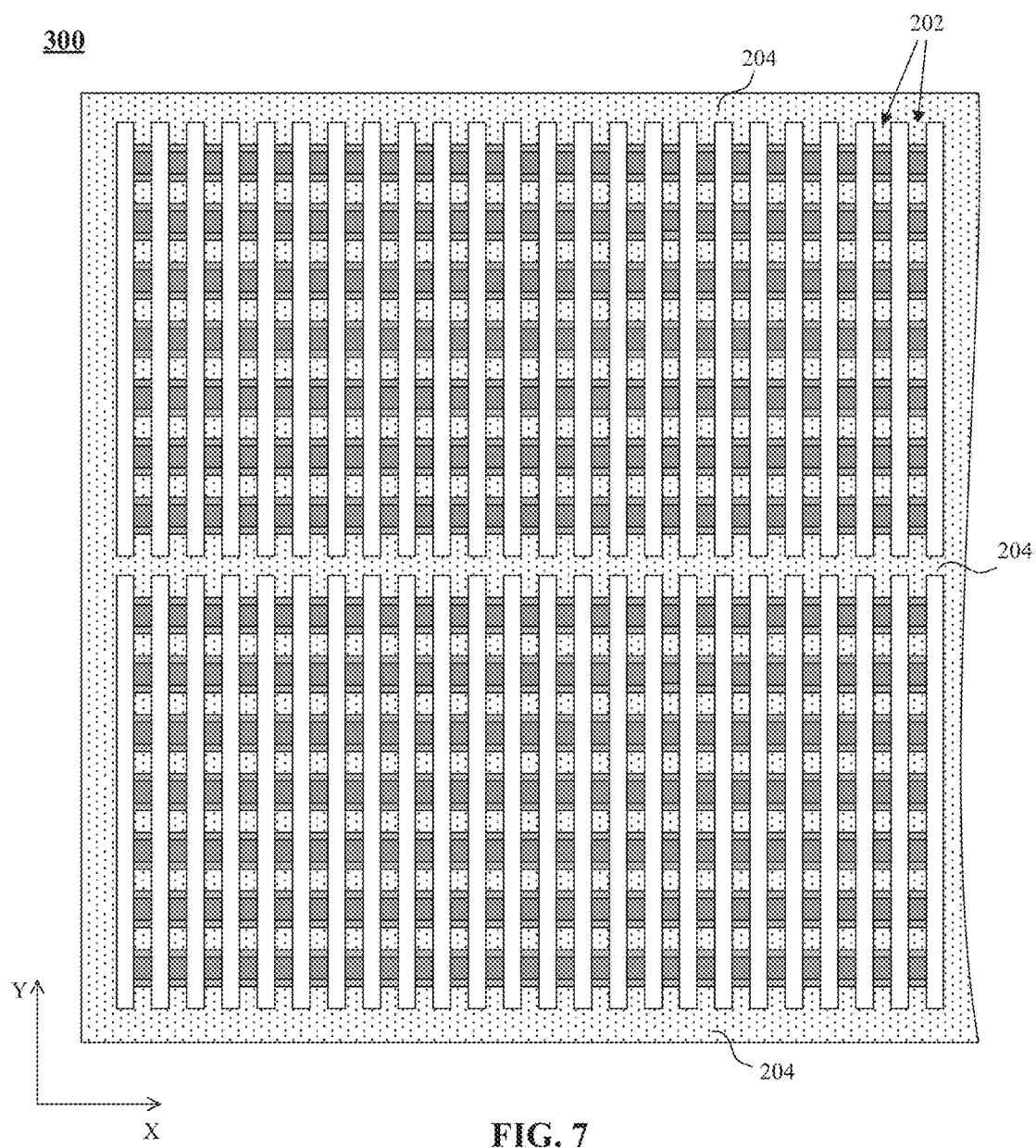
FIG. 7 is a top plan view of a universal QFN lead frame in accordance with another embodiment of the present invention.

FIG. 7 is a top plan view of a lead frame strip 300 in accordance with another embodiment of the present invention. In a preferred embodiment, the lead frame strip 300 includes at least one additional tie bar 204 bridging the plurality of ribs 202 at a middle portion thereof to provide additional support and prevent the ribs from sagging.

FIGS. 8-13 are a series of diagrams illustrating steps in forming the lead frame strip 200 in accordance with an embodiment of the present invention.

Figure 8:
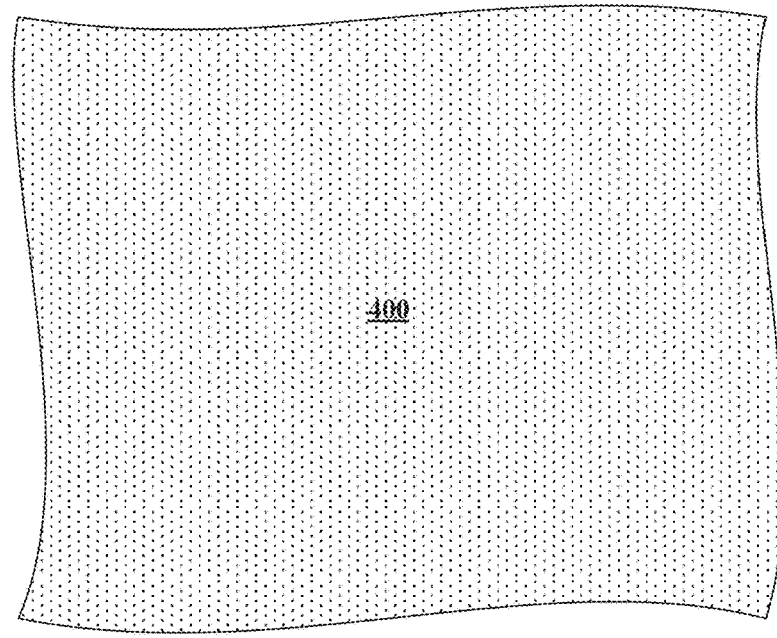
FIGS. 8-13 are a series of diagrams illustrating steps for assembling a universal QFN lead frame in accordance with an embodiment of the present invention.

Starting from FIG. 8, an electrically conductive sheet 400 is provided. In a preferred embodiment, the sheet 400 comprises a conductive metal such as Cu, and is pre-plated with a protective metal or metal alloy such as with Ni—Pd—Au, which facilitates wire bonding by allowing for good bonds between bond wires and the bond pads, and facilitates soldering of a device formed using the lead frame 200 to a PCB.

Figure 9:
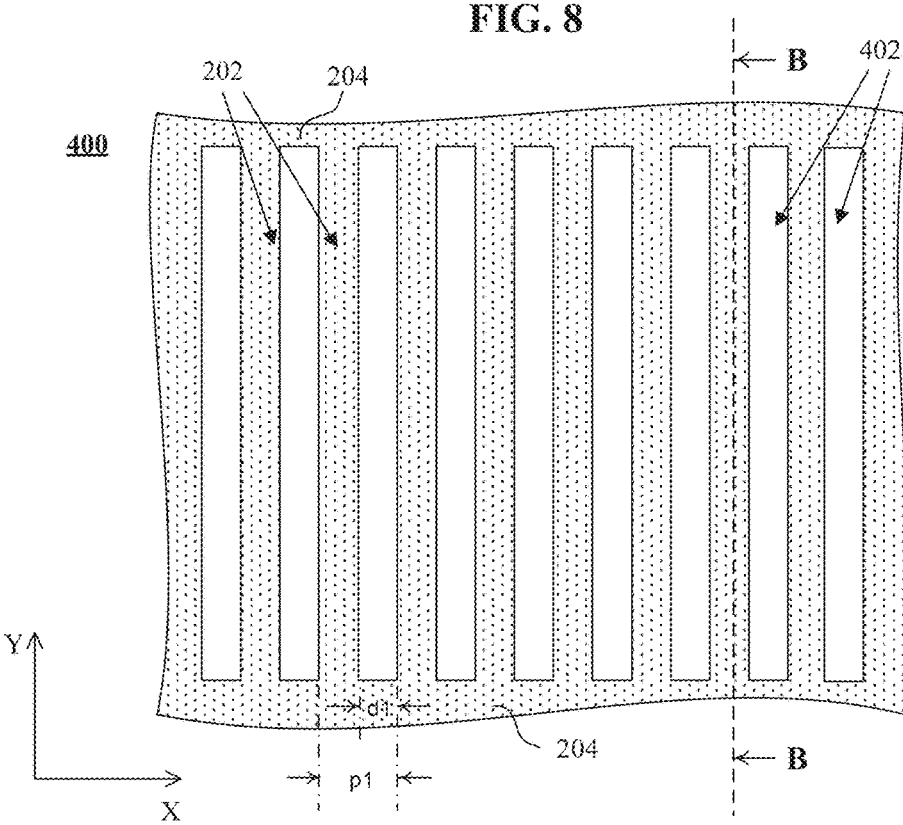

In the next step, illustrated in FIG. 9, a plurality of parallel openings 402 extending in the Y direction are formed in the electrically conductive sheet 400, resulting in a plurality of parallel ribs 202 also extending in the Y direction, and at least two tie bars 204 extending in the X direction. The tie bars 204 hold the plurality of ribs 202 at two opposite ends thereof. In a preferred embodiment, a width d1 of the opening 402 between adjacent ribs 202 is 0.2~0.3 mm, and the pitch p1 between adjacent ribs 202 is 0.45~0.55 mm.

Figure 10:
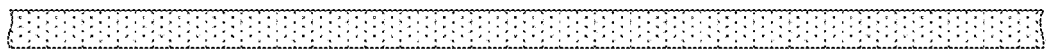

FIG. 10 is a cross-sectional side view of the rib 202 of FIG. 9 along line B-B. In a preferred embodiment, the electrically conductive sheet 400, and therefore the rib 202, has a thickness of 0.120~0.134 mm.

Figure 11:
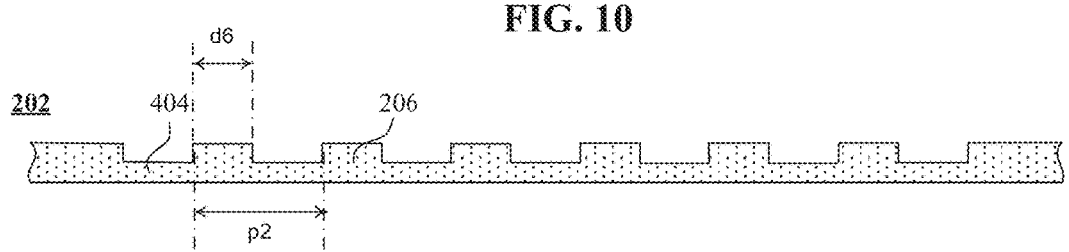

In the next step illustrated in FIG. 11, a plurality of recessed portions 404 are formed in the rib 202 such as with a half-etching process. In a preferred embodiment, a thickness of the recessed portion 404 is half of the thickness of the rib 202. The recessed portions 404 form teeth between adjacent recessed portions 404. The teeth form a plurality of bond pad portions 206 of the rib 202. In a preferred embodiment, the pitch p2 between adjacent bond pad portions 206 in one rib 202 is 0.75~0.85 mm, and a length d6 of the bond pad portion 206 is 0.25~0.35 mm.

Figure 12:
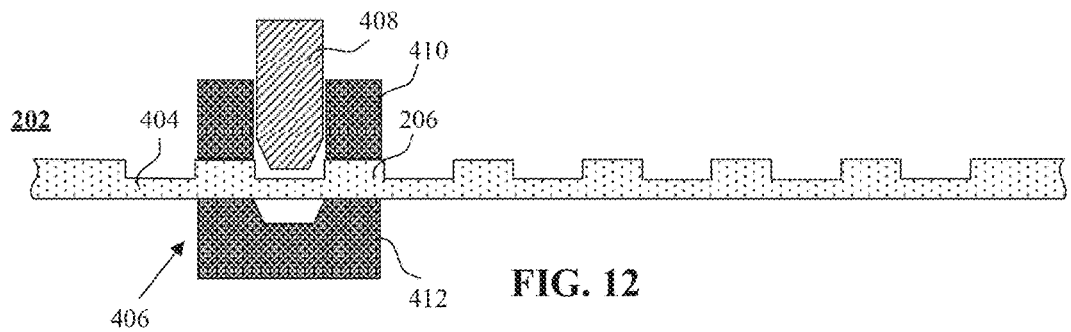

In the next step illustrated in FIG. 12, the rib 202 is clamped with a clamping tool 406 at the bond pad portions 206, and downward coining is performed by pushing down the plurality of recessed portions 404 with an extruding tool 408. In a preferred embodiment, the clamping tool 406 includes an upper portion 410 attached to an upper surface of the bond pad portions 206, and a lower portion attached to a lower surface of the bond pad portions 206. In a preferred embodiment, a lower portion 412 of the clamping tool 406 and a tip of the extruding tool 408 are matched to downward coin the recessed portion 404 to form a solder pad portion 208 of the rib 202, as shown in FIG. 13.

Figure 13:
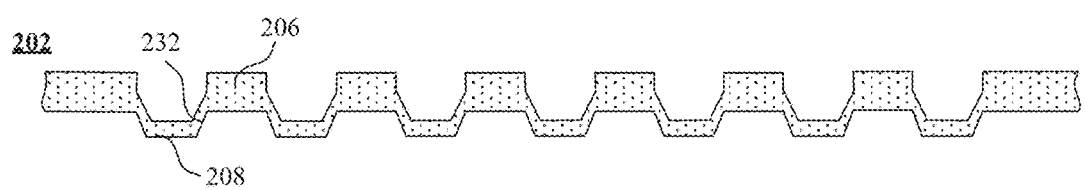

In FIG. 13, the rib 202 now has a plurality of bond pad portions 206 and a plurality of solder pad portions 208 that are horizontally staggered with and vertically down-set from the plurality of bond pad portions 206. The rib 202 further includes a plurality of connection portions 232 that respectively connect adjacent bond pad portion 206 and solder pad portion 208.

FIGS. 14-19 are a series of diagrams illustrating steps in assembling a semiconductor device using the lead frame strip 200 in accordance with an embodiment of the present invention.

Figure 14:
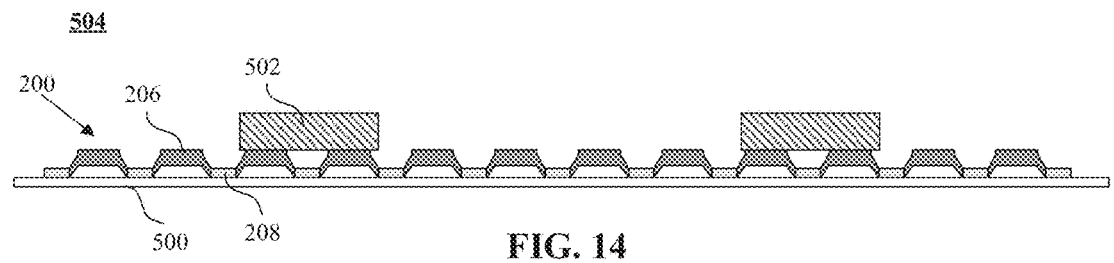
FIGS. 14-17, 18A-18B, and 19A-19C are a series of diagrams illustrating steps in assembling a semiconductor device using a universal QFN lead frame in accordance with an embodiment of the present invention.

Starting from FIG. 14, the plurality of solder pad portions 208 of the lead frame strip 200 are attached on a carrier 500. In a preferred embodiment, the carrier 500 is an adhesive tape that holds the lead frame strip 200 during die bonding and wire bonding processes. At least one semiconductor die 502 is attached on at least one of the bond pad portions 206 of the lead frame strip 200. In a preferred embodiment, more than one semiconductor die 502 is attached on the lead frame strip 200 so that multiple packages may be assembled simultaneously, thus the strip 200 and dies 502 form an array of packages 504.

Figure 15:
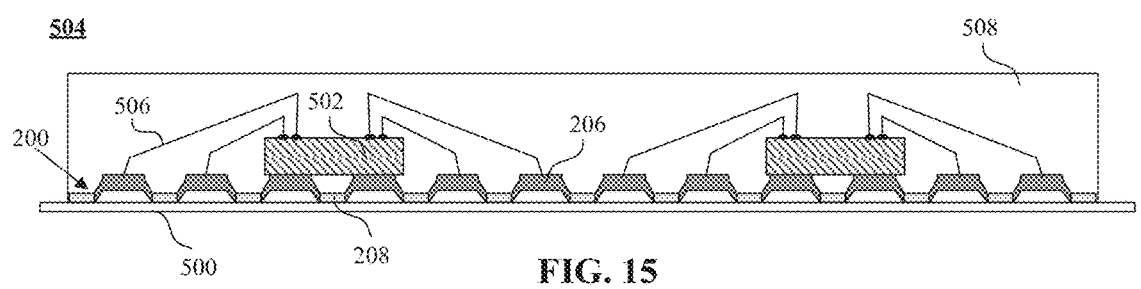

In the next step, illustrated in FIG. 15, the semiconductor dies 502 are electrically connected to a plurality of bond pad portions 206 of the lead frame strip 200. In a preferred embodiment, the semiconductor dies 502 are electrically connected to the bond pad portions 206 with bond wires 506. The semiconductor dies 502, the bond wires 506 and the lead frame strip 200 are covered with a molding material 508 in an encapsulation step, where a bottom surface of each solder pad portion 208 is exposed from the molding material 508 for electrically connecting the semiconductor die 502 to other devices, e.g., a PCB (not shown).

Figure 16:
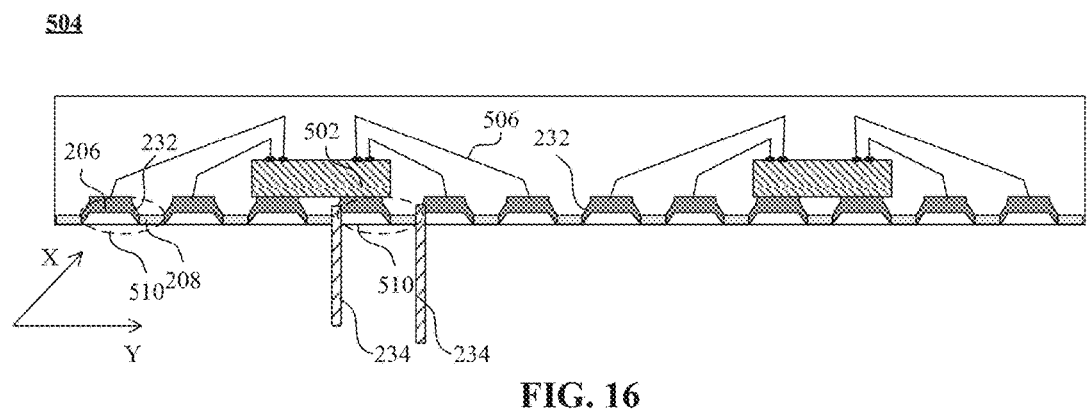

In the next step, illustrated in FIG. 16, after encapsulation, the carrier 500 is removed and a half-cut process is performed. In the half-cut process, the connection portions 232 of a rib 202 are alternately cut by the blade 234 to form a plurality of isolated leads 510. Each lead 510 comprises a bond pad portion 206 and a solder pad portion 208 down-set from the bond pad portion 206. The solder pad portion 208 extends horizontally from the bond pad portion 206 via the connection portion 232 of the lead 510. Since the connection portion 232 extends downwardly from the bond pad portion 206, cutting the bond wires 506 located near the bond pad portion 206 is avoided. In addition, the half-cut process is only performed in the X direction as compared to the conventional multi-row QFN package 100 shown in FIG. 1, so the time required to perform the half-cut process is less.

Figure 17:
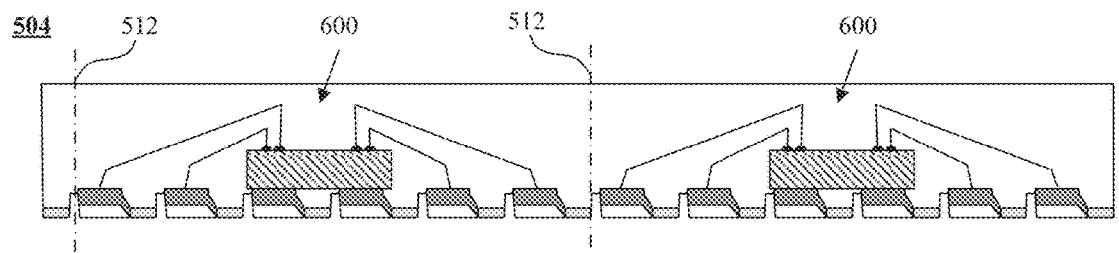

In the next step, illustrated in FIG. 17, package singulation is performed by cutting along line 512 to form separate semiconductor devices 600.

Figure 18A:
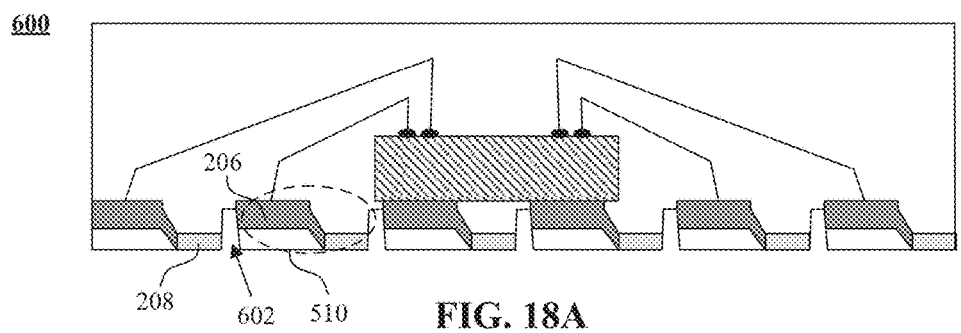

FIG. 18A is an enlarged cross-sectional side view of the semiconductor device 600 after package singulation. In a preferred embodiment, a width w of the blade 234 (see FIG. 16) is equal to or less than the horizontal width of the gap between adjacent bond pad portion 206 and solder pad portion 208, and the half-cut is performed within the gap resulting in a groove 602 located therein.

Figure 18B:
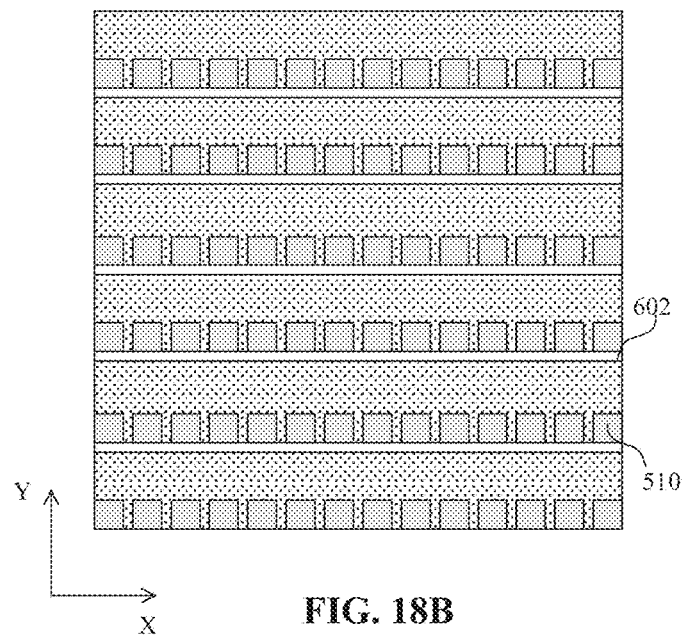

FIG. 18B is a bottom plan view of the semiconductor device 600. The semiconductor device 600 comprises a plurality of grooves 602 at the bottom surface extending in the X direction. Each groove 602 physically and electrically isolates adjacent leads 510 in the Y direction from each other.

Figure 19A:
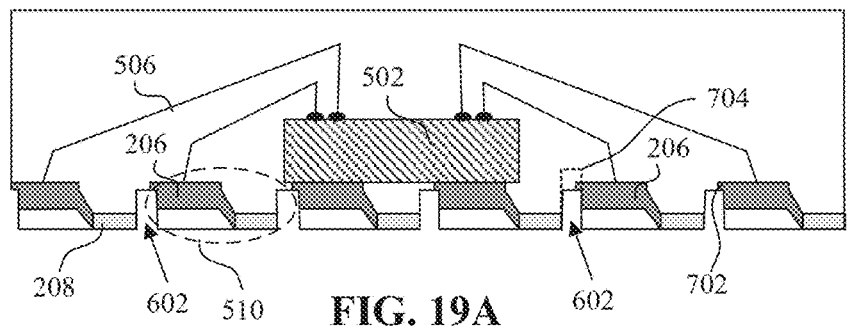

FIG. 19A is an enlarged cross-sectional side view of a semiconductor device 700a after package singulation in accordance with another embodiment of the present invention. The semiconductor device 700a is substantially similar to the semiconductor device 600 shown in FIG. 18A except that the bond pad portion 206 is partially half-cut, such that a part 702 of the bond pad portion 206 is exposed from a back side of the semiconductor device 700a. The part 702 allows for half-cut quality inspection. That is, if the exposed part 702 of the bond pad portion 206 were not visible from the back side of the semiconductor device 700a, the half-cut might be determined to be an overcut or a bad cut, since the depth of the groove 602 may have exceeded a top surface of the bond pad portion 206 as shown with dotted lines as groove 704, which then there would be a risk of cutting the bond wires 506 or the semiconductor die 502.

Figure 19B:
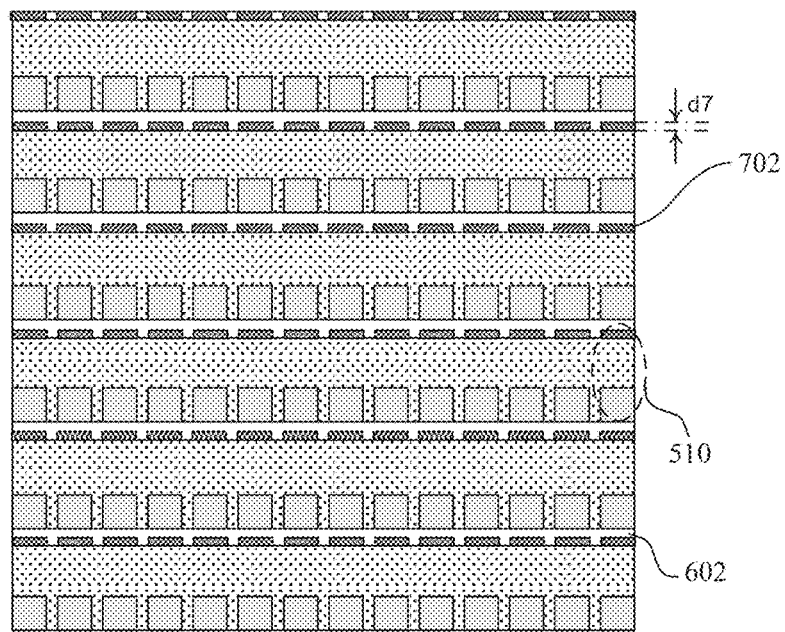

FIG. 19B is a bottom plan view of the semiconductor device 700a, and shows that the semiconductor device 700a comprises a plurality of grooves 602 at the bottom surface extending in the X direction. Each groove 602 physically and electrically isolates adjacent leads 510 in the Y direction from each other. In a preferred embodiment, each bond pad portion 206 has the exposed part 702 visible from the back side of the semiconductor device 700a. In a preferred embodiment, a width d7 of the exposed part 702 has a range of 0.02~0.04 mm, and targets on 0.03 mm.

In a preferred embodiment, half-cutting the bond pad portion 206 is achieved using a blade having a width w larger than the horizontal width of the gap between the adjacent bond pad portion 206 and solder pad portion 208.

Figure 19C:
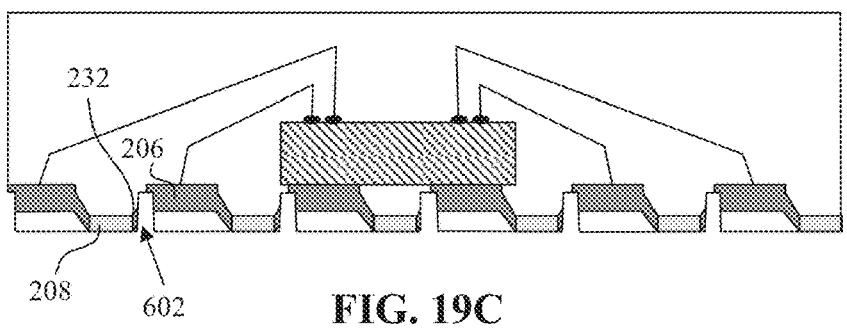

FIG. 19C is an enlarged cross-sectional side view of a semiconductor device 700b after package singulation in accordance with yet another embodiment of the present invention. The semiconductor device 700b is substantially the same as the semiconductor device 700a shown in FIG. 19A except that the groove 602 is slightly narrower than that in FIG. 19A, such that part of the connection portion 232 is left remaining in the semiconductor device 700b. In a preferred embodiment, half-cutting the bond pad portion 206 is achieved by slightly shifting or offsetting the blade towards the bond pad portion 206 as compared to the half-cut shown in FIG. 18A.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A semiconductor device, comprising:
    a lead frame having a plurality of leads arranged in an array that comprises a plurality of columns extending in a first direction and a plurality of rows extending in a second direction, wherein each lead comprises a bond pad portion located in a first plane, and a solder pad portion located in a second plane that is parallel to and down-set from the first plane, wherein the bond pad portion and the solder pad portion of each lead are staggered, and the solder pad portion horizontally extends from the bond pad portion in the first direction;
    a semiconductor die mounted on the bond pad portions of a first set of the plurality of leads and electrically connected to the bond pad portion of at least one lead of a second set of the plurality of leads, wherein the first and second sets of the plurality of leads do not intersect; and
    a molding material encapsulating the semiconductor die, and the plurality of leads, wherein the molding material defines a package body and the solder pad portion of each lead is exposed at a back side of the package body.

2. The semiconductor device of claim 1, wherein each lead further comprises a connection portion connecting the bond pad portion and the solder pad portion.

3. The semiconductor device of claim 2, wherein the bond pad portion vertically protrudes from the connection portion.

4. The semiconductor device of claim 1, further comprising a plurality of grooves on the back side of the package body extending in the second direction, wherein each groove physically and electrically isolates adjacent leads in a column from each other.

5. The semiconductor devices of claim 4, wherein each bond pad portion is partially exposed from a bottom surface of the groove.

6. The semiconductor device of claim 1, further comprising at least one bond wire that electrically connects a die bond pad of the semiconductor die to the bond pad portion of the at least one lead of the second set of the plurality of leads.

7. The semiconductor device of claim 1, wherein a thickness of the solder pad portion is half of a thickness of the bond pad portion.

8. The semiconductor device of claim 1, wherein adjacent leads in each row are electrically insulated from each other by the molding material.

9. The semiconductor device of claim 1, wherein a density of leads in each row is higher than a density of leads in each column.

* * * * *